(12) United States Patent
Shiomi

(10) Patent No.: US 6,466,506 B2
(45) Date of Patent: Oct. 15, 2002

(54) SEMICONDUCTOR MEMORY DEVICE CAPABLE OF REPAIRING SMALL LEAK FAILURE

(75) Inventor: Toru Shiomi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/793,768

(22) Filed: Feb. 27, 2001

(65) Prior Publication Data

US 2002/0034093 A1 Mar. 21, 2002

(30) Foreign Application Priority Data

Sep. 18, 2000 (JP) .......................... 2000-281397

(51) Int. Cl.[7] .............................................. G11C 8/00
(52) U.S. Cl. ................... 365/229; 365/227; 365/226; 365/188; 365/174
(58) Field of Search .................. 365/189.01, 226, 365/227, 229, 188, 174

(56) References Cited

U.S. PATENT DOCUMENTS 5,673,232 A * 9/1997 Furutani ..................... 365/226
5,805,508 A * 9/1998 Tobita ...................... 365/189.09
6,046,627 A * 4/2000 Itoh et al. ................... 327/546
RE36,932 E * 10/2000 Furutani ...................... 365/226
6,232,793 B1 * 5/2001 Arimoto et al. ............... 326/34
6,300,819 B1 * 10/2001 De et al. ..................... 327/534

FOREIGN PATENT DOCUMENTS

| JP | 8-45299 | | 2/1996 |
| JP | 8-138399 | | 5/1996 |
| JP | 411007776 A | * | 1/1999 |
| JP | 0200012809 A | * | 1/2000 |
| JP | 02000294751 A | * | 10/2000 |

* cited by examiner

Primary Examiner—Viet Q. Nguyen
(74) Attorney, Agent, or Firm—McDermott, Will & Emery

(57) ABSTRACT

A power supply potential GNDP as a substrate potential of two N-channel MOS transistors constructing an SRAM transistor memory cell is enabled to be controlled independent of a ground potential GNDM as a source potential of the N-channel MOS transistors. In the case where a standby current failure occurs, by weakening the driving ability of the N-channel MOS transistors by a substrate effect, the failure can be found in a functional test. A defective memory cell as a cause of the standby current failure, in which a small leak occurs can be specified and is replaced by a redundant memory cell, thereby enabling the yield to be improved.

9 Claims, 18 Drawing Sheets

SEMICONDUCTOR MEMORY DEVICE CAPABLE OF REPAIRING SMALL LEAK FAILURE

BACKGROUND OF THE INVENTION

1. Field of the Invention

The present invention relates to a semiconductor memory device and, more particularly, to a semiconductor memory device capable of specifying and replacing a memory cell including a small leak failure, thereby realizing an improved yield.

2. Description of the Background Art

A semiconductor memory device, especially, a static random access memory (SRAM) has features of easy control, high processing speed, and a small standby current during standby.

FIG. 17 is a circuit diagram showing the configuration of a conventional CMOS SRAM memory cell.

Referring to FIG. 17, a conventional memory cell includes: an N-channel MOS transistor 580 which is connected between a bit line BL and a storage node N100 and whose gate is connected to a word line WL; and an N-channel MOS transistor 582 which is connected between a bit line /BL and a storage node N111 and whose gate is connected to the word line WL. The transistors each connecting a memory cell and a bit line are also called access transistors.

The conventional memory cell further includes: an N-channel MOS transistor 574 whose source is coupled to a ground potential GNDM of a memory cell array, whose drain is connected to the storage node N100, and whose gate is connected to the storage node N111; and an N-channel MOS transistor 578 whose source is coupled to the ground potential GNDM, whose drain is connected to the storage node N 111, and whose gate is connected to the storage node N100. The transistors each for driving a storage node to the L level are also called driver transistors.

The conventional memory cell further includes: a P-channel MOS transistor 572 whose source is coupled to a power supply potential VCCM for the memory cell array, whose drain is connected to the storage node N100, and whose gate is connected to the storage node N111; and a P-channel MOS transistor 576 whose source is connected to the power supply potential VCCM, whose drain is connected to the storage node N111, and whose gate is connected to the storage node N100. The transistors each for bringing a storage node up to the H level are also called load transistors. A load transistor may be replaced by a high-resistance element.

FIG. 18 is a diagram showing an example where a small short circuit occurs between a storage node in the CMOS SRAM memory cell illustrated in FIG. 17 and the power source potential VCCM.

Referring to FIG. 18, the storage node N111 in the memory cell is connected to the node to which the power supply potential VCCM is applied via a resistor R11 having a high resistance value. Such a failure can be caused by a foreign matter such as a dust in a fabricating process, an unsatisfied etching condition, and the like.

As shown in FIG. 18, when the storage node N111 as the drain of the P-channel MOS transistor 576 and also as the drain of the N-channel MOS transistor 578 holds the "L" level, a through current flows from the power supply potential VCCM to the ground potential GNDM in the path indicated by the arrow. Since the current continuously flows also in a standby state, a standby failure occurs in the semiconductor memory device.

The standby failure denotes a failure which occurs when a consumption current of the SRAM at the time of standby in a state where data is not accessed from the outside is larger than a specified value.

In the case where the resistance value of the resistor R11 is sufficiently larger than resistance when the N-channel MOS transistor 578 is conducting, however, no particular influence is exerted on the function of reading/writing data from/to the SRAM. That is, no particular influence is exerted on the function and only a phenomenon that the standby current increases occurs. In such a case, there are problems such that a memory cell in which the standby current increases cannot be specified, so that even if the SRAM has a redundant circuit for replacement, the failure cannot be repaired.

FIG. 19 is a diagram showing an example where a small short circuit occurs between the storage node in the CMOS SRAM memory cell illustrated in FIG. 17 and the ground potential GNDM.

Referring to FIG. 19, the storage node N100 is coupled to the ground potential GNDM via a resistor R11a having a high resistance value. In a manner similar to the case of FIG. 18, such a failure can happen due to a foreign matter such as a dust in a fabricating process, an unsatisfied etching condition, and the like. When the storage node N100 holds the "H" level and the storage node N111 holds the "L" level, a small amount of a leak current flows from the storage node N100 via the resistor R11a to a node to which the ground potential GNDM is applied.

Since the current continuously flows also in the standby state, a standby failure occurs in the semiconductor memory device.

In the case where the resistance R11a is sufficiently larger than resistance when the P-channel MOS transistor 572 as a load transistor is conducting, an influence is not particularly exerted on the operating function of the chip. That is, only the phenomenon that the standby current increases in the semiconductor memory device can be found from the outside. In such a case as well, there is a problem such that the memory cell in which the standby current increases cannot be specified and a repair cannot be made even if the chip has a redundant circuit.

FIG. 20 is a schematic diagram showing arrangement of circuit blocks of a conventional semiconductor memory device and arrangement of pads for receiving power supply potentials and pads for receiving ground potentials.

Referring to FIG. 20, a memory cell array 640 is disposed in the center portion of a chip 632. Peripheral circuits 642 and 644 are disposed on both sides of the memory cell array 640. In proximity to the middle point of one of long sides of the chip 632, a pad 634 for supplying a power supply potential VCC to the peripheral circuits 642 and 644 and a pad 636 for supplying a power supply potential VCCM are disposed. The pad 634 and the peripheral circuits 642 and 644 are connected via a power supply line 652. The pad 636 and the memory cell array 640 are connected via a power supply line 654.

In proximity to the middle point of the other long side of the chip 632, a pad 646 for supplying a ground potential GND to the peripheral circuits 642 and 644 and a pad 648 for supplying a ground potential GNDM to the memory cell array 640 are disposed. The pad 646 and the peripheral circuits 642 and 644 are connected via a power supply line 658. The pad 648 and the memory cell array 640 are connected via a power supply line 660.

In the conventional technique as well, as shown in FIG. 20, by providing the power supply potentials for the memory cell array and the peripheral circuits and the ground potentials for the memory cell array and the peripheral circuits so as to be isolated from each other, for example, whether a standby current failure is caused by the peripheral circuits or the memory cell can be determined. By making such determination, the semiconductor process can be improved.

In the case where the cause of the standby current failure is, for example, a memory cell, however, in the conventional configuration, it is difficult to specify a defective memory cell as the cause of the failure. The chip cannot be therefore repaired by replacing the defective memory cell by using the redundant circuit. Although inventions intended to repair the standby current failure and the like, such as the invention of semiconductor memory device and method of detecting DC current failure in memory cell described in Japanese Patent Laying-Open No. 8-45299 and the invention of semiconductor memory device described in Japanese Patent Laying-Open No. 8-138399 have been made, an invention teaching a method of specifying and repailing a defective memory cell has not been achieved.

SUMMARY OF THE INVENTION

An object of the present invention is to provide a semiconductor memory device capable of detecting and repairing a direct current failure such as a standby current failure, thereby realizing an improved yield.

The invention relates to, in short, a semiconductor memory device formed on the main surface of a semiconductor substrate, having a memory cell array including a plurality of memory cells each having a storage node for storing data, which are arranged in a matrix.

Each of the memory cells includes: a first field effect transistor of a second conduction type which is formed in a first well of a first conduction type formed on the semiconductor substrate and whose drain is connected to the storage node; a first power supply node to which a first power supply potential is applied and which is connected to a source of the first field effect transistor; and a second power supply node to which a second power supply potential is applied and which is connected to the first well.

According to another aspect of the invention, the invention provides a method of testing a semiconductor memory device formed on the main surface of a semiconductor substrate, including the step of setting a potential and the step of conducting a functional test.

The semiconductor memory device includes a memory cell array including a plurality of memory cells each having a storage node for storing data, which are arranged in a matrix.

Each of the memory cells includes: a first field effect transistor of a second conduction type which is formed in a first well of a first conduction type formed on the semiconductor substrate and whose drain is connected to the storage node; a first power supply node to which a first power supply potential is applied and which is connected to a source of the first field effect transistor; and a second power supply node to which a second power supply potential is applied and which is connected to the first well.

The step of setting the potential sets the second power supply potential to a potential different from the first power supply potential. The step of conducting the functional test conducts a functional test of allowing the storage node to store data and reading the data.

Therefore, a major advantage of the present invention is that the well potential and the source potential of a memory cell transistor are set to be different from each other at the time of a test, a threshold voltage is changed by a substrate bias effect to thereby make operating conditions severer, and a test can be carried out under the conditions. Further, a memory cell as a cause of a standby failure can be specified and replaced, thereby enabling the yield to be improved.

Further another advantage of the invention is that, since the well potential and the source potential of a memory cell transistor are set to be different from each other at the time of a test, the threshold voltage is changed by a substrate bias effect to thereby make operating conditions severer, and a test can be carried out under the conditions, a memory cell as a cause of a standby failure can be specified.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a diagram for explaining repair of a memory cell which becomes defective due to a standby failure or the like;

DESCRIPTION OF THE PREFERRED EMBODIMENTS

Figure 1:
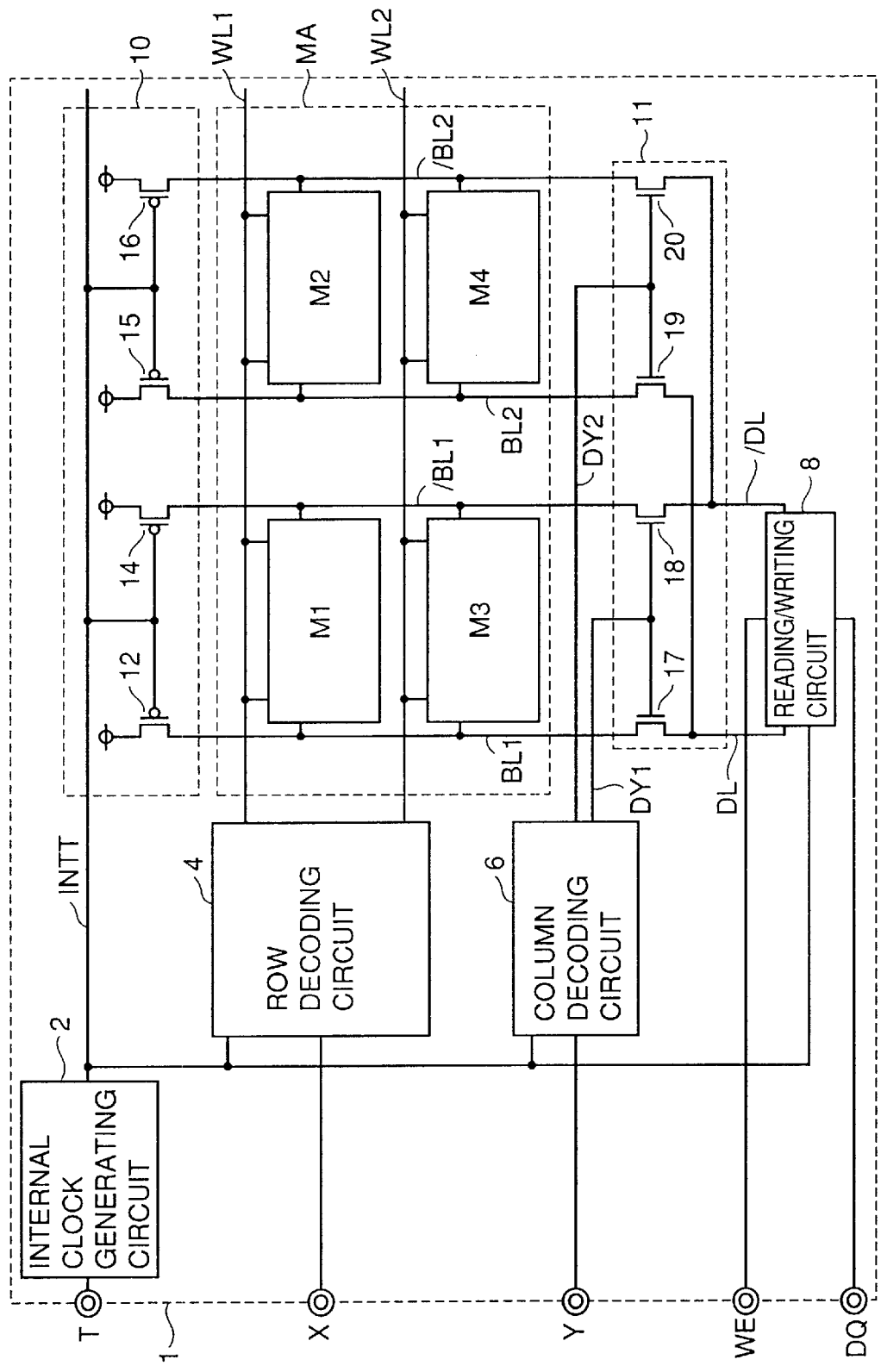
FIG. 1 is a block diagram showing the configuration of a semiconductor memory device 1 according to a first embodiment of the invention.

Embodiments of the invention will be described in detail hereinbelow with reference to the drawings. In the drawings, the same reference numeral denotes the same or corresponding portion.

First Embodiment

FIG. 1 is a block diagram showing the configuration of a semiconductor memory device 1 according to a first embodiment of the invention.

Referring to FIG. 1, the semiconductor memory device 1 includes: a memory array MA including memory cells M1, M2, M3, and M4 which are arranged in a matrix; a word line WL1 for selecting the memory cells M1 and M2; a word line WL2 for selecting the memory cells M3 and M4; bit lines BL1 and /BL1 provided in correspondence with the memory cells M1 and M3; bit lines BL2 and /BL2 provided in correspondence with the memory cells M2 and M4; and an internal clock generating circuit 2 for outputting an internal dock signal INTT according to a clock signal T.

The semiconductor memory device 1 further includes: a precharging circuit 10 for precharging the bit lines BL1, /BL1, BL2, and /BL2 in accordance with the internal clock signal INTT; a row decoding circuit 4 for activating the word lines WL1 and WL2 in accordance with the internal clock signal INTT and a row address signal X; a column decoding circuit 6 for outputting column selection signals DY1 and DY2 in accordance with the internal clock signal INTT and a column address signal Y; a gate circuit 11 for connecting the bit line BL1 or BL2 to a data line DL in accordance with the column selection signal DY1 and connecting the bit line /BL1 or /BL2 to a data line /DL in accordance with the column selection signal DY2; and a reading/writing circuit 8 for writing a data signal DQ to a memory cell in accordance with the write control signal VVE and outputting data read from the memory cell as the data signal DQ at the time of reading data.

The precharging circuit 10 includes: a P-channel MOS transistor 12 which is connected between the power supply node and the bit line BL1 and receives the internal clock signal INTT by its gate; a P-channel MOS transistor 14 which is connected between the power supply node and the bit line /BL1 and receives the internal clock signal INTT by its gate; a P-channel MOS transistor 15 which is connected between the power supply node and the bit line BL2 and receives the internal clock signal INTT by its gate; and a P-channel MOS transistor 16 which is connected between the power supply node and the bit line /BL2 and receives the internal clock signal INTT by its gate.

The gate circuit 11 includes: an N-channel MOS transistor 17 which is activated in response to the column 'selection signal DY1 to connect the bit line BL1 and the data line DL; an N-channel MOS transistor 18 which is activated in response to the column selection signal DY1 to connect the bit line /BL1 and the data line /DL; an N-channel MOS transistor 19 which is activated in response to the column selection signal DY2 to connect the bit line BL2 and the data line DL; and an N-channel MOS transistor 20 which is activated in response to the column selection signal DY2 to connect the bit line /BL2 and the data line /DL.

Since the internal clock generating circuit 2, the row decoding circuit 4, the column decoding circuit 6, and the like are disposed around the memory array MA, they are generically called peripheral circuits.

Figure 2:
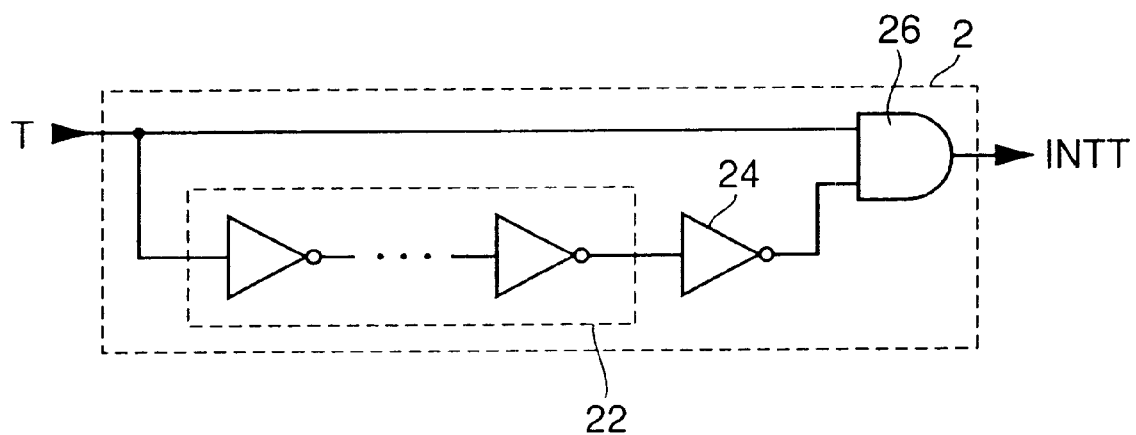
FIG. 2 is a circuit diagram showing the configuration of an internal dock generating circuit 2 illustrated in FIG. 1.

FIG. 2 is a circuit diagram showing the configuration of the internal clock generating circuit 2 illustrated in FIG. 1.

Referring to FIG. 2, the internal clock generating circuit 2 includes: a delay circuit 22 for receiving and delaying the clock signal T; an inverter 24 for receiving and inverting an output of the delay circuit 22; and an AND circuit 26 for receiving the clock signal T and an output of the inverter 24. The AND circuit 26 outputs the internal clock signal INTT.

The delay circuit 22 is constructed by, for example, inverters of even stages which are connected in series.

Figure 3:
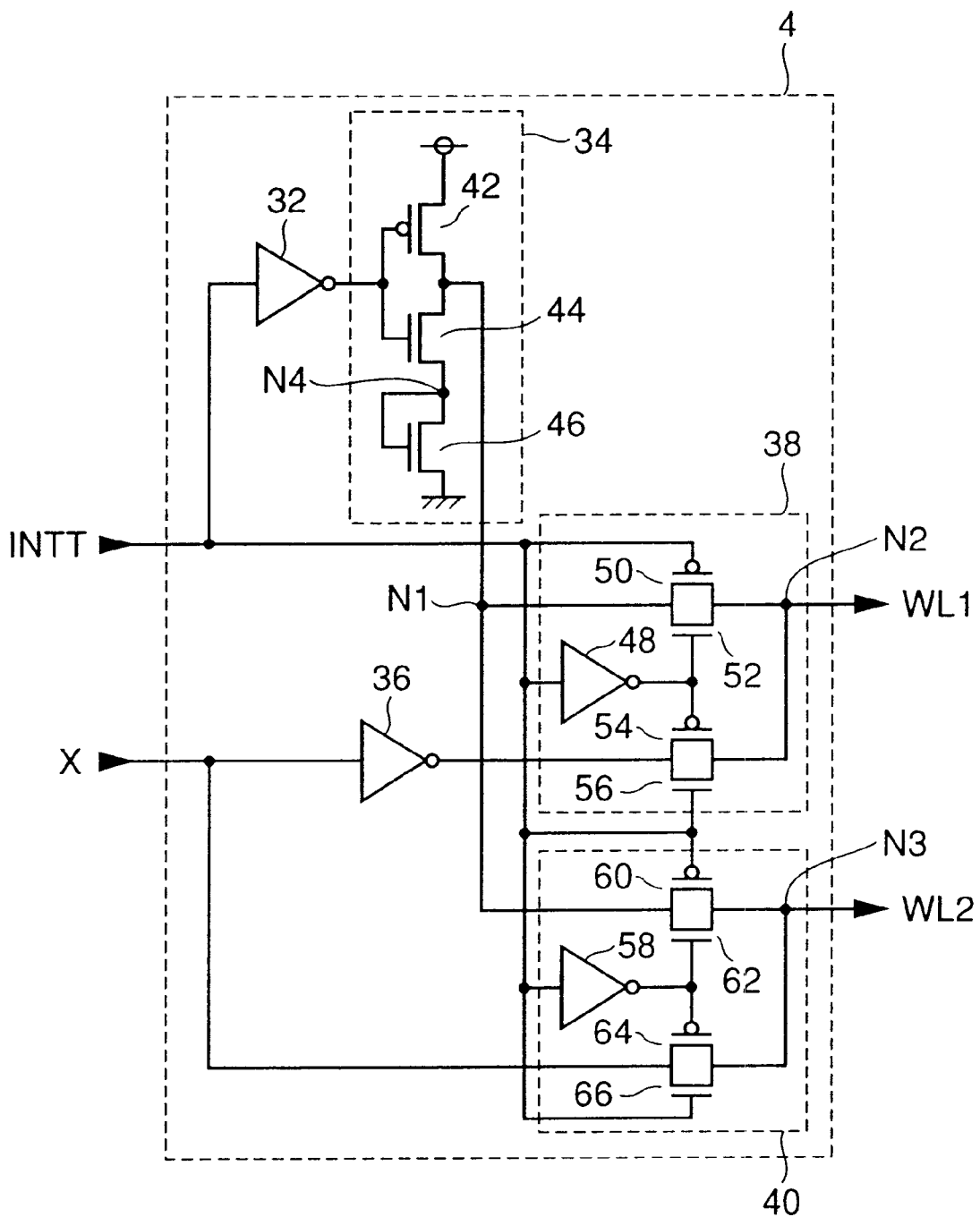
FIG. 3 is a circuit diagram showing the configuration of a row decoding circuit 4 in FIG. 1.

FIG. 3 is a circuit diagram showing the configuration of the row decoding circuit 4 in FIG. 1.

Referring to FIG. 3, the row decoding circuit 4 includes: an inverter 32 for receiving and inverting the internal clock signal INTT; an inverter 34 for receiving and inverting an output of the inverter 32 and outputting a resultant signal to the node N1; an inverter 36 for receiving and inverting the row address signal X; a selecting circuit 38 for outputting either an output of the inverter 34 or an output of the inverter 36 to the word line VVL1 in accordance with the internal clock signal INTT; and a selecting circuit 40 for outputting either the address signal X or an output of the inverter 34 to the word line WL2 in accordance with the internal clock signal INTT.

The inverter 34 includes: an N-channel MOS transistor 46 whose source is connected to a ground node and whose gate and drain are connected to a node N4; and a P-channel MOS transistor 42 and an N-channel MOS transistor 44 which are connected in series between the power supply node and the node N4 and receive an output of the inverter 32 by their gates. An output of the inverter 34 is sent from a connection node between the P-channel MOS transistor 42 and the N-channel MOS transistor 44. The output is supplied to the node N1.

The selecting circuit 38 includes: an inverter 48 for receiving and inverting the internal clock signal INTT; a P-channel MOS transistor 50 which is connected between the node N1 and a node N2 and receives the internal clock signal INTT by its gate; an N-channel MOS transistor 52 which is connected between the nodes N1 and N2 and receives an output of the inverter 48 by its gate; a P-channel MOS transistor 54 which is connected between an output node of the inverter 36 and the node N2 and receives an output of the inverter 48 by its gate; and an N-channel MOS transistor 56 which is connected between the output node of the inverter 36 and the node N2 and receives the internal clock signal INTT by its gate.

The selecting circuit 40 includes: an inverter 58 for receiving and inverting the internal clock signal INTT; a P-channel MOS transistor 60 which is connected between the node N1 and a node N3 and receives the internal clock signal INTT by its gate; an N-channel MOS transistor 62 which is connected between the nodes N1 and N3 and receives an output of the inverter 58 by its gate; a P-channel MOS transistor 64 which is connected between a node to which the row address signal X is supplied and the node N3 and receives an output of the inverter 58 by its gate; and an N-channel MOS transistor 66 which is connected between the node to which the row address signal X is supplied and the node N3 and receives the internal clock signal INTT by its gate.

Figure 4:
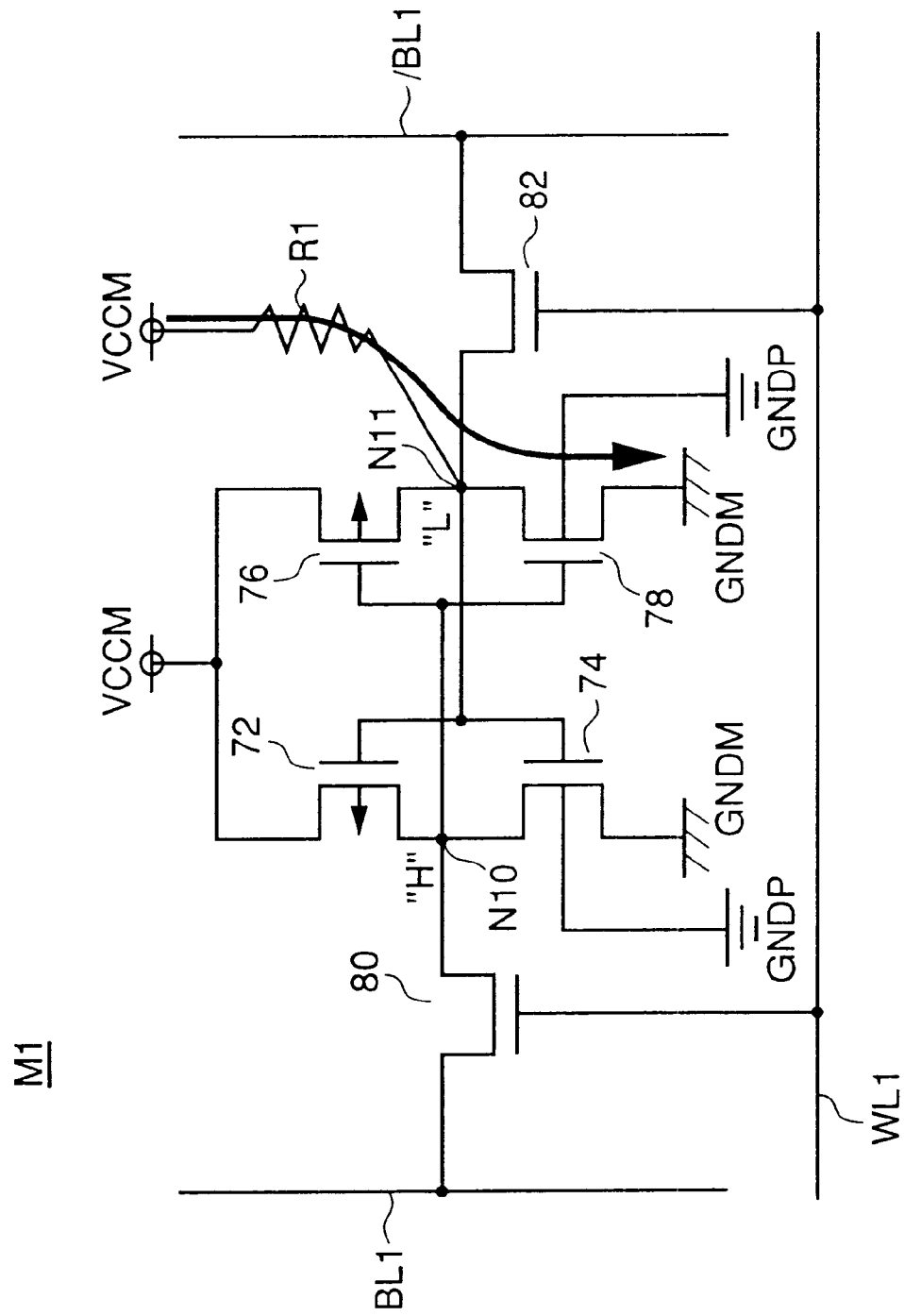
FIG. 4 is a circuit diagram showing the configuration of a memory cell M1 illustrated in FIG. 1.

FIG. 4 is a circuit diagram showing the configuration of the memory cell M1 illustrated in FIG. 1.

Referring to FIG. 4, the memory cell M1 includes: an N-channel MOS transistor 80 which is connected between the bit line BL1 and a storage node N10 and whose gate is connected to the word line WL1; and an N-channel MOS transistor 82 which is connected between the bit line /BL1 and a storage node N11 and whose gate is connected to the word line WL1.

The memory cell M1 further includes: an N-channel MOS transistor 74 whose source is coupled to the ground potential GNDM of the memory cell array, whose drain is connected to the storage node N10, and whose gate is connected to the storage node N11; and an N-channel MOS transistor 78 whose source is coupled to the ground potential GNDM, whose drain is connected to the storage node Nil, and whose gate is connected to the storage node N10.

The memory cell M1 further includes: a P-channel MOS transistor 72 whose source is coupled to the power supply potential VCCM for a memory cell array, whose drain is connected to the storage node N10, and whose gate is connected to the storage node N11; and a P-channel MOS transistor 76 whose source is connected to the power supply potential VCCM, whose drain is connected to the storage node N11, and whose gate is connected to the storage node N10.

Figure 18:
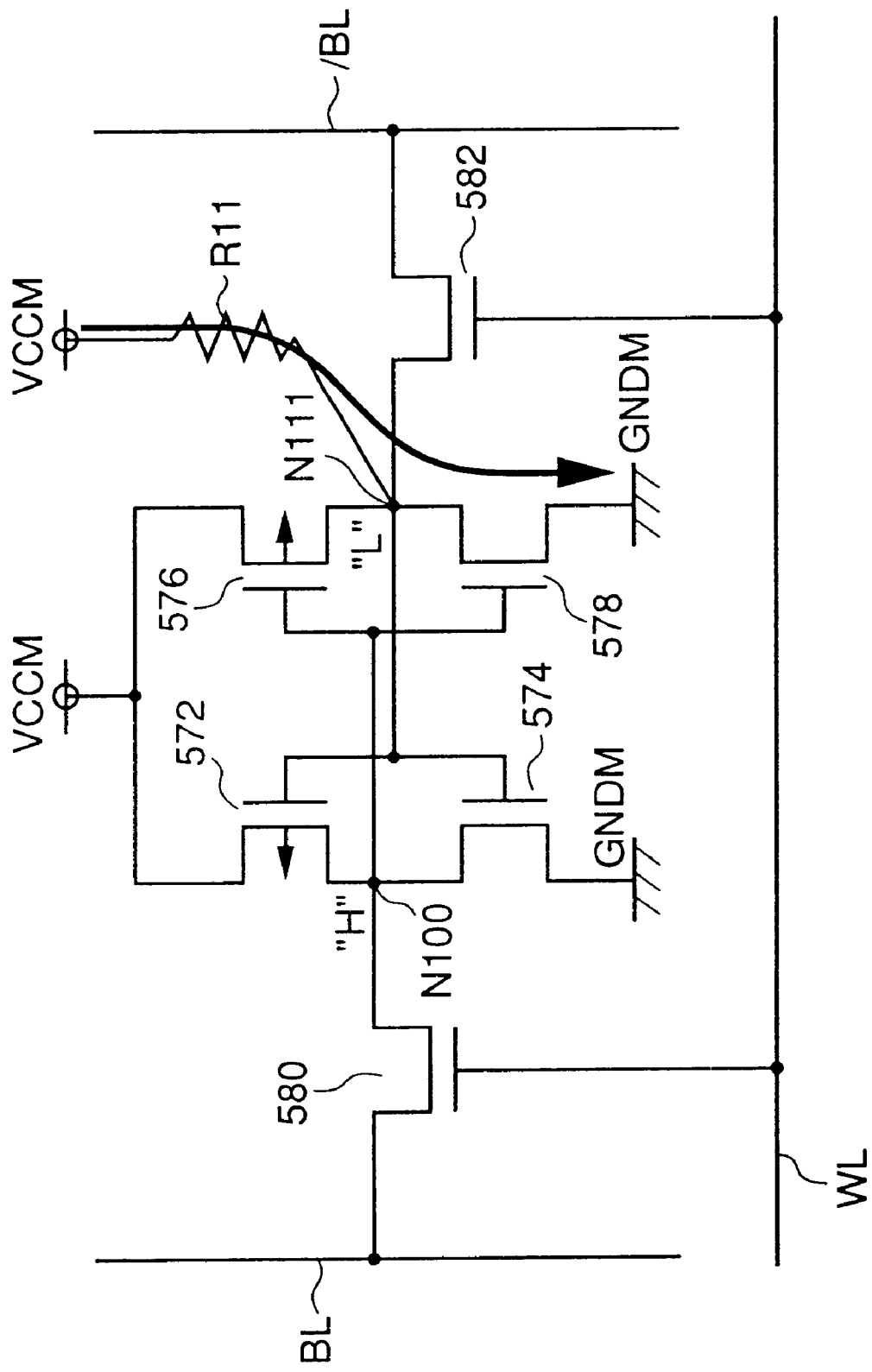
FIG. 18 is a diagram showing an example where a small short circuit occurs between a storage node in the CMOS SRAM memory cell illustrated in FIG. 17 and a power supply potential VCCM.

A case where a short circuit by which the storage node N11 in the memory cell M1 is coupled to the power supply potential VCCM in the memory cell array via the resistor R1 occurs will now be examined. It is different from the conventional technique shown in FIG. 18 that the substrate potential of the N-channel MOS transistors 74 and 78 is isolated from the ground potential GNDM as a source potential and is coupled to the ground potential GNDP which can be independently controlled.

As shown in FIG. 4, when the storage node N11 is at the "L" level, a through current flows in the path indicated by the arrow. Since the current continuously flows also in the standby state, a standby failure occurs in the semiconductor memory device.

In the first embodiment of the invention, by setting the ground potential GNDP to be lower than the ground potential GNDM at the time of a wafer test, a substrate (substrate bias effect) is used to increase a threshold voltage Vth of the N-channel MOS transistors 74 and 78. As a result, the current driving ability of the N-channel MOS transistor 78 is weakened. Consequently, the "L" level of the storage node N11 rises. When the resistance in the state where the N-channel MOS transistor 78 is conductive becomes almost equal to the resistor R1 having a high resistance value, a flip flop in the memory cell is finally inverted. That is, an erroneous operation of the memory cell can be detected in a functional test.

By isolating the substrate potential of the N-channel MOS transistors 74 and 78 from the ground potential GNDM of the memory cell, detection of an unstable memory cell is facilitated. The first embodiment of the invention is especially effective at detecting a small short circuit between the power supply potential VCCM and the storage node. Since a defective memory cell can be specified, the defective memory cell can be therefore replaced by a redundant memory cell by using a redundant circuit. An effect such that the yield can be improved is produced.

Second Embodiment

Figure 5:
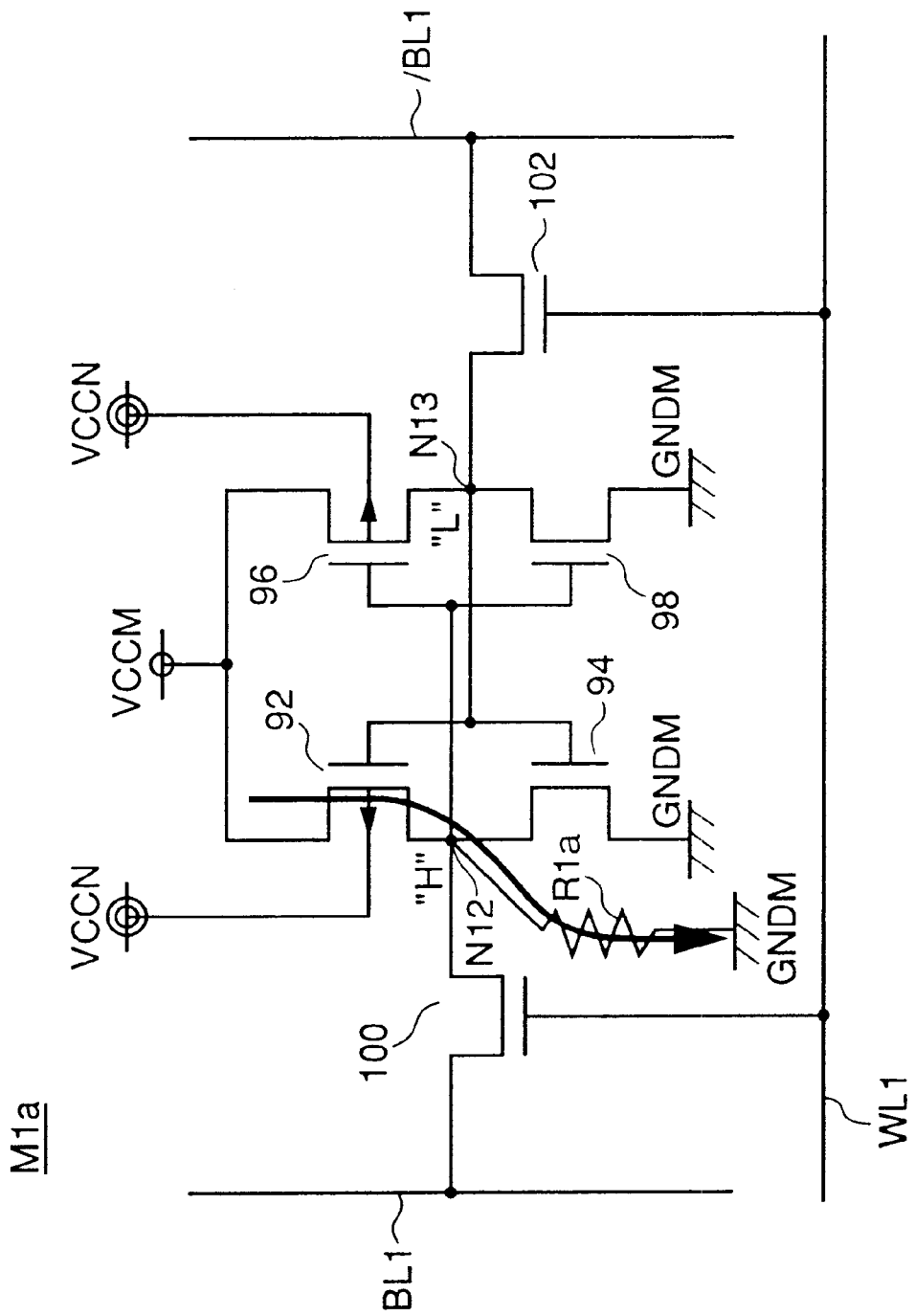
FIG. 5 is a circuit diagram showing the configuration of a memory cell M1a in a second embodiment.

FIG. 5 is a circuit diagram showing the configuration of a memory cell M1a in a second embodiment.

Referring to FIG. 5, the memory cell M1a includes: an N-channel MOS transistor 100 which is connected between the bit line BL1 and a storage node N12 and whose gate is connected to the word line VL1; and an N-channel MOS transistor 102 which is connected between the bit line /BL1 and a storage node N13 and whose gate is connected to the word line WL1.

The memory cell M1a further includes: an N-channel MOS transistor 94 whose source is coupled to the ground potential GNDM of the memory cell array, whose drain is connected to the storage node N12, and whose gate is connected to the storage node N13; and an N-channel MOS transistor 98 whose source is coupled to the ground potential GNDM, whose drain is connected to the storage node N13, and whose gate is connected to the storage node N12.

The memory cell M1a further includes: a P-channel MOS transistor 92 whose source is coupled to the power supply potential VCCM for the memory cell array, whose drain is connected to the storage node N12, and whose gate is connected to the storage node N13; and a P-channel MOS transistor 96 whose source is coupled to the power supply potential VCCM, whose drain is connected to the storage node N13, and whose gate is connected to the storage node N12.

Figure 19:
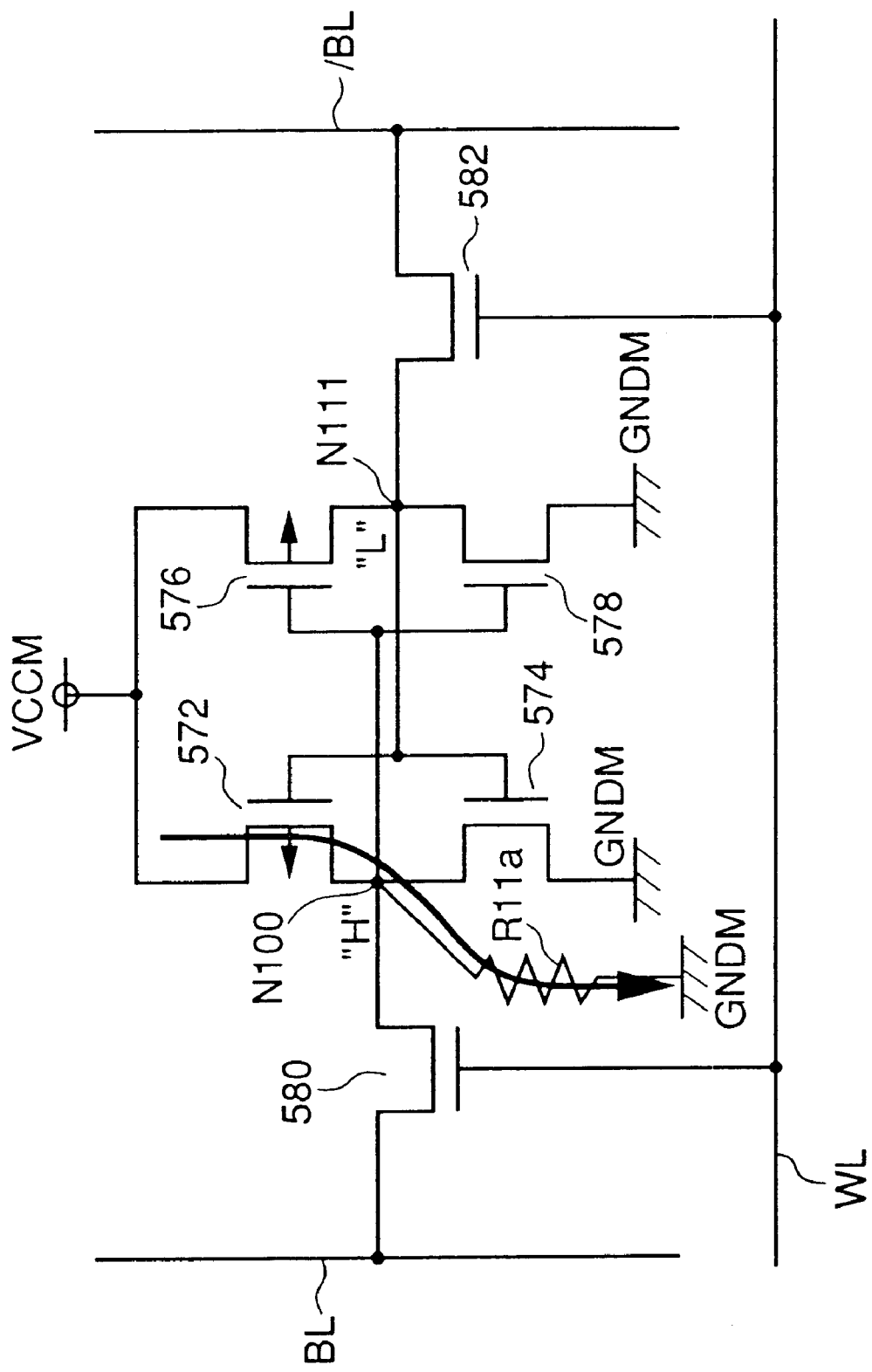
FIG. 19 is a diagram showing an example where a small short circuit occurs between the storage node in the CMOS SRAM memory cell illustrated in FIG. 17 and a ground potential GNDM.
Figure 20:
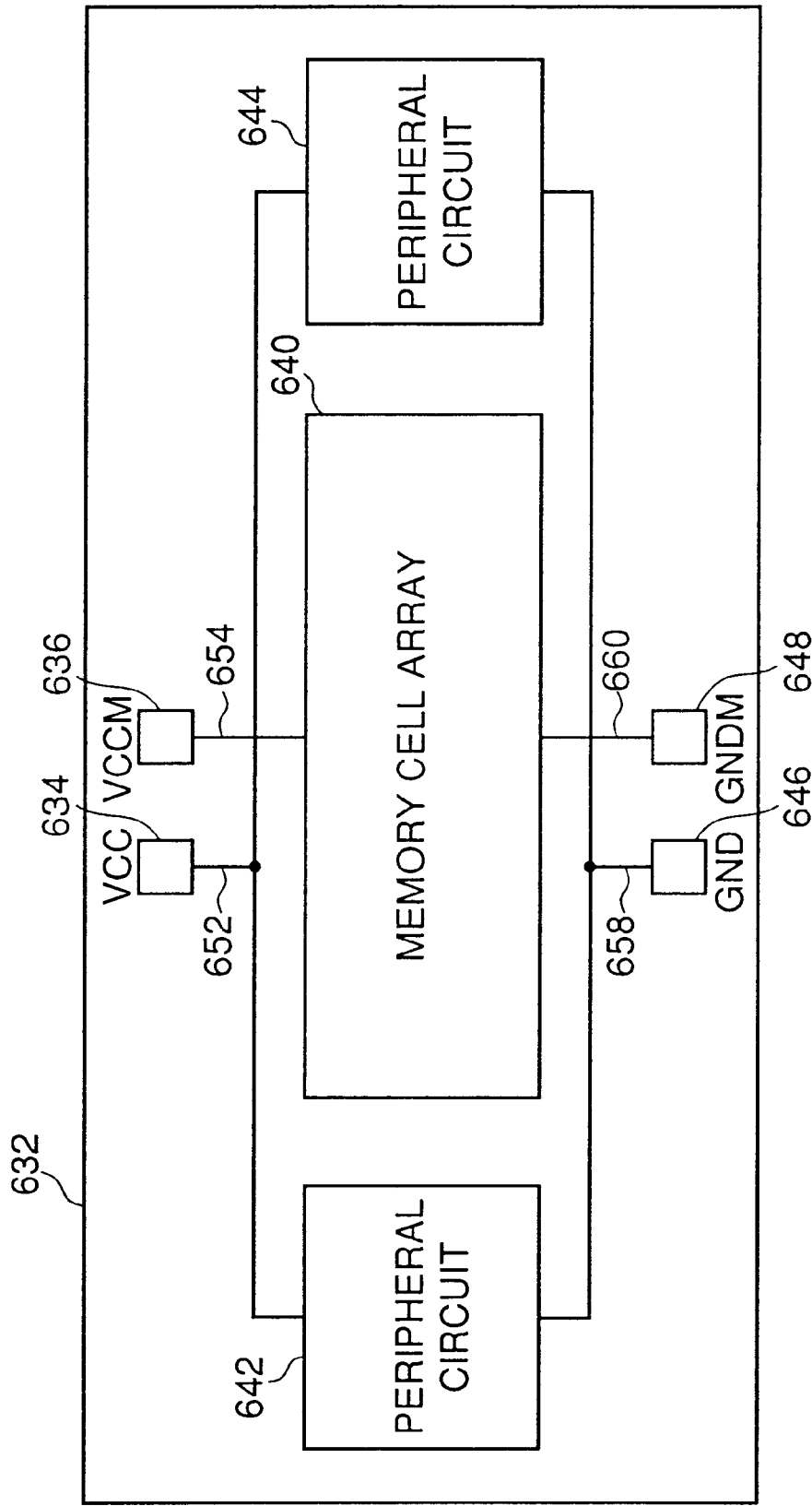
FIG. 20 is a schematic diagram showing arrangement of circuit blocks of a conventional semiconductor memory device and arrangement of pads for receiving power supply potentials and ground potentials.

The difference from the conventional technique shown in FIG. 19 is that the substrate potential of the P-channel MOS transistors 92 and 96 is isolated from the power supply potential VCCM as a source potential and is coupled to the power supply potential VCCN which can be independently controlled. When the storage node N12 is coupled to the ground potential GNDM via high resistance R1a and a small short circuit occurs, a through current flows in the path indicated by the arrow in the drawing. It occurs when the storage node N12 holds the "H" level. Since the current continuously flows also in the standby state, a standby failure occurs in the semiconductor memory device.

In the second embodiment, by setting the power supply potential VCCM to be lower than the power supply potential VCCN at the time of a wafer test, a substrate effect is used to increase a threshold voltage Vth of the P-channel MOS transistor 92. As a result, the current driving ability of the P-channel MOS transistor 92 is weakened, the "H" level of the storage node N12 drops. When the resistance at the time of conduction becomes almost equal to the resistance R1a, data held by a flip flop in the memory cell is finally inverted. That is, an erroneous operation can be caused only in a defective memory cell by the functional test and, therefore, the defective memory cell can be detected.

As described above, by isolating the substrate potential of the P-channel MOS transistors 92 and 96 from the power supply potential VCCM of the memory cell, detection of an unstable memory cell is facilitated. The second embodiment of the invention is especially effective at detecting a small short circuit between the ground potential GNDM and the storage node. According to the invention, since a defective memory cell can be specified, the defective memory cell can be replaced by a redundant memory cell by using a redundant circuit. Thus, an effect such that the yield can be improved is produced.

Third Embodiment

Figure 6:
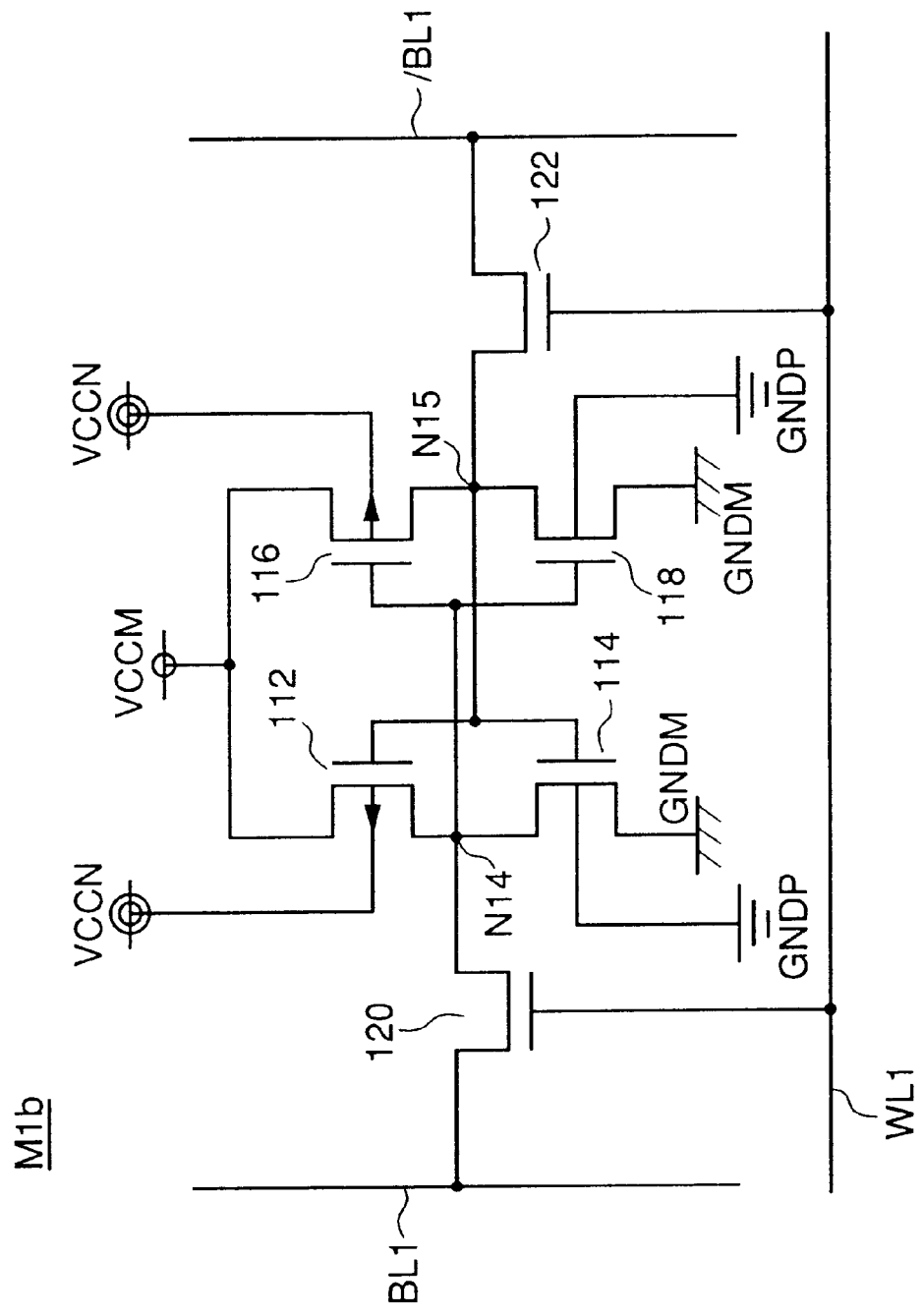
FIG. 6 is a circuit diagram showing the configuration of a memory cell M1b used in a third embodiment.

FIG. 6 is a circuit diagram showing the configuration of a memory cell M1b used in a third embodiment.

Referring to FIG. 6, the memory cell M1b includes: an N-channel MOS transistor 120 which is connected between the bit line BL1 and a storage node N14 and whose gate is connected to the word line WL1; and an N-channel MOS transistor 122 which is connected between the bit line /BL1 and a storage node N15 and whose gate is connected to the word line WL1.

The memory cell M1b further includes: an N-channel MOS transistor 114 whose source is coupled to the ground potential GNDM of the memory cell array, whose drain is connected to the storage node N14, and whose gate is connected to the storage node N15; and an N-channel MOS transistor 118 whose source is coupled to the ground potential GNDM, whose drain is connected to the storage node N15, and whose gate is connected to the storage node N14.

The memory cell M1b further includes: a P-channel MOS transistor 112 whose source is coupled to the power supply potential VCCM for the memory cell array, whose drain is connected to the storage node N14, and whose gate is connected to the storage node N15; and a P-channel MOS transistor 116 whose source is coupled to the power supply potential VCCM, whose drain is connected to the storage node N15, and whose gate is connected to the storage node N14.

The substrate potential of each of the P-channel MOS transistors 112 and 116 is coupled to the power supply potential VCCN which can be controlled independently of the power supply potential VCCM of the memory cell.

On the other hand, the substrate potential of each of the N-channel MOS transistors 114 and 118 is coupled to the ground potential GNDP which can be controlled independently of the ground potential GNDM of the memory cell.

With such a configuration, at the time of a wafer test, the ground potential GNDP is set to be lower than the ground potential GNDM, and the power supply potential VCCM can be set to be lower than the power supply potential VCCN. By such setting, detection of a small short circuit which occurs between the power supply potential VCCM and the storage node and between the ground potential GNDM and the storage node is facilitated.

Therefore, by conducting a functional test, a defective memory cell can be specified, the defective memory cell can be replaced by a redundant memory cell by using a redundant circuit. An effect such that the yield can be improved is produced.

Fourth Embodiment

Figure 7:
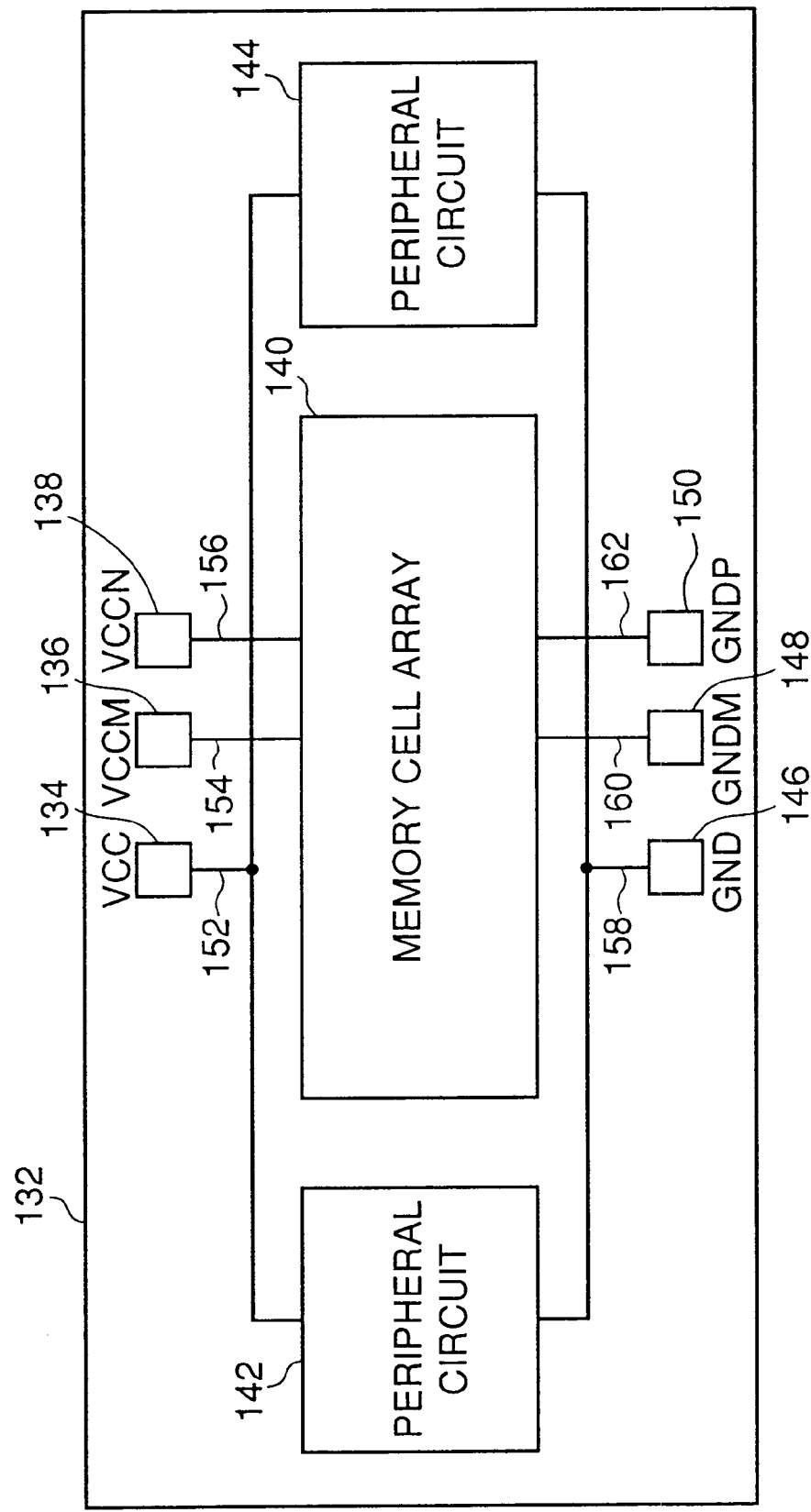
FIG. 7 is a schematic diagram showing arrangement of circuit blocks of a semiconductor memory device of a fourth embodiment and arrangement of pads for receiving power supply potentials and ground potentials.

FIG. 7 is a schematic diagram showing arrangement of circuit blocks of a semiconductor memory device of a fourth embodiment and arrangement of pads for receiving power supply potentials and ground potentials.

Referring to FIG. 7, a memory cell array 140 is disposed in the center portion of a chip 132. Peripheral circuits 142 and 144 are disposed on both sides of the memory cell array 140. Related circuits for controlling the memory cell array on the basis of a control signal and data supplied from the outside and transmitting/receiving data to/from the memory cell array are generically called the peripheral circuits 142 and 144. For example, the row decoding circuit 4, the column decoding circuit 6, and the like in FIG. 1 are representative circuit blocks of the peripheral circuits.

In proximity to the middle point of one of long sides of the chip 132, a pad 134 for supplying the power supply potential VCC to the peripheral circuits 142 and 144 and a pad 136 for supplying the power supply potential VCCM to the memory cell array 140 are disposed. The pad 134 and the peripheral circuits 142 and 144 are connected via a power supply line 152. The pad 136 and the memory cell array 140 are connected via a power supply line 154.

In proximity to the middle point of the other long side of the chip 132, a pad 146 for supplying the ground potential GND to the peripheral circuits 142 and 144 and a pad 148 for supplying the ground potential GNDM to the memory cell array 140 are disposed. The pad 146 and the peripheral circuits 142 and 144 are connected via a power supply line 158. The pad 148 and the memory cell array 140 are connected to each other via a power supply line 160.

The chip 132 is further provided with: a pad 138 for receiving the power supply potential VCCN to be applied to the N-well in the memory cell; a power supply line 156 for supplying the power supply potential VCCN to the memory cell array 140; a pad 150 for receiving the ground potential GNDP to be applied to the P-well in the memory cell; and a power supply line 162 for applying the ground potential GNDP to the memory cell array 140.

The pad 138 is disposed adjacent to the pad 136. The pad 150 is disposed adjacent to the pad 148.

In FIG. 7, at the time of a wafer test, first, the power supply potential VCC is set to be equal to the power supply potential VCCM, and the power supply potential VCCN is set to be higher than the power supply potentials VCC and VCCM. Then a functional test is carried out. As a second step, the ground potential GND is set to be equal to the ground potential GNDM, and the ground potential GNDP is set to be lower than those ground potentials GND and GNDM. Then, a functional test is carried out. After that, as will be described hereinlater, a standby failure cell is repaired by laser trimming or the like.

After completion of the wafer test, in assembly, the pads 134, 136, and 138 are connected to a common lead and the pads 146, 148, and 150 are connected to a common lead. By disposing three pads so as to be adjacent to each other for the power supply potentials and three pads so as to be adjacent to each other for the ground potentials, the pads can be easily connected to the common leads by wire bonding.

Specifically, by using such a configuration, even in the case where only one pin each exists for a power source terminal and a ground terminal in a general memory or the like, potentials of pads can be applied by different probes in a wafer test and controlled independently. Since three power supply pads are provided adjacent to each other, the three pads can be wire-bonded to a single lead in assembling and sealing processes. The three pads for receiving the ground potentials can be also wire-bonded to a common lead.

Even in the case where only one pin each exists for the power supply and ground terminals in a general memory or the like, by finding a defective memory cell at the time of a wafer test and replacing the defective memory cell with a redundant circuit, the yield can be improved.

Fifth Embodiment

In a fifth embodiment, a method of constructing a memory cell array will be described.

Figure 8:
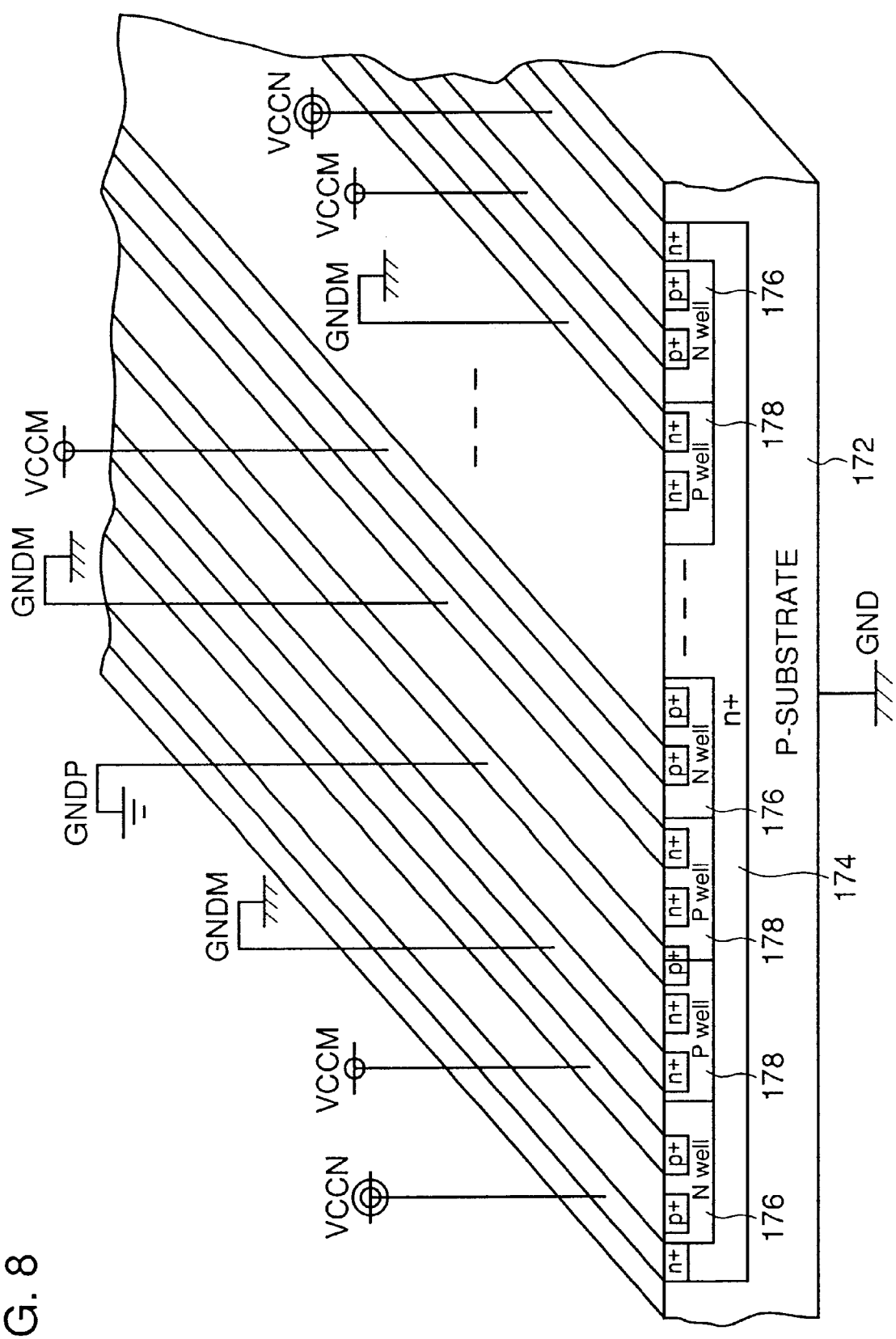
FIG. 8 is a diagram showing a first example of the configuration of the memory cell array illustrated in FIG. 6.

FIG. 8 is a diagram showing a first example of the configuration of the memory cell array illustrated in FIG. 6.

Referring to FIG. 8, an N-type buried layer 174 is provided on a P-substrate 172. In the buried layer 174, N-wells 176 and P-wells 178 are provided. An n+ type impurity region is provided in each of the peripheral portions of the buried layer 174. The power supply potential VCCN is applied to the impurity region. The power supply potential VCCN is the potential of the buried layer 174. In the N-well 176, a p+ type impurity region serving as the source of a transistor is provided and the power supply potential VCCM is applied to the impurity region.

On the other hand, an n+ type impurity region serving as the source of a transistor is provided in the P-well 178, and the ground potential GNDM is applied to the impurity region. A p+ type impurity region is provided in the P-well 178, and the ground potential GNDP is applied so as to supply the potential of the P-well. The substrate 172 is coupled to the ground potential GND.

The structure of the well shown in FIG. 8 is what is called a triple well structure. In the structure, in order to electrically isolate the well of the same conduction type as that of the substrate from the substrate, a deeper well is provided and a well to be isolated is provided within the deeper well.

Figure 9:
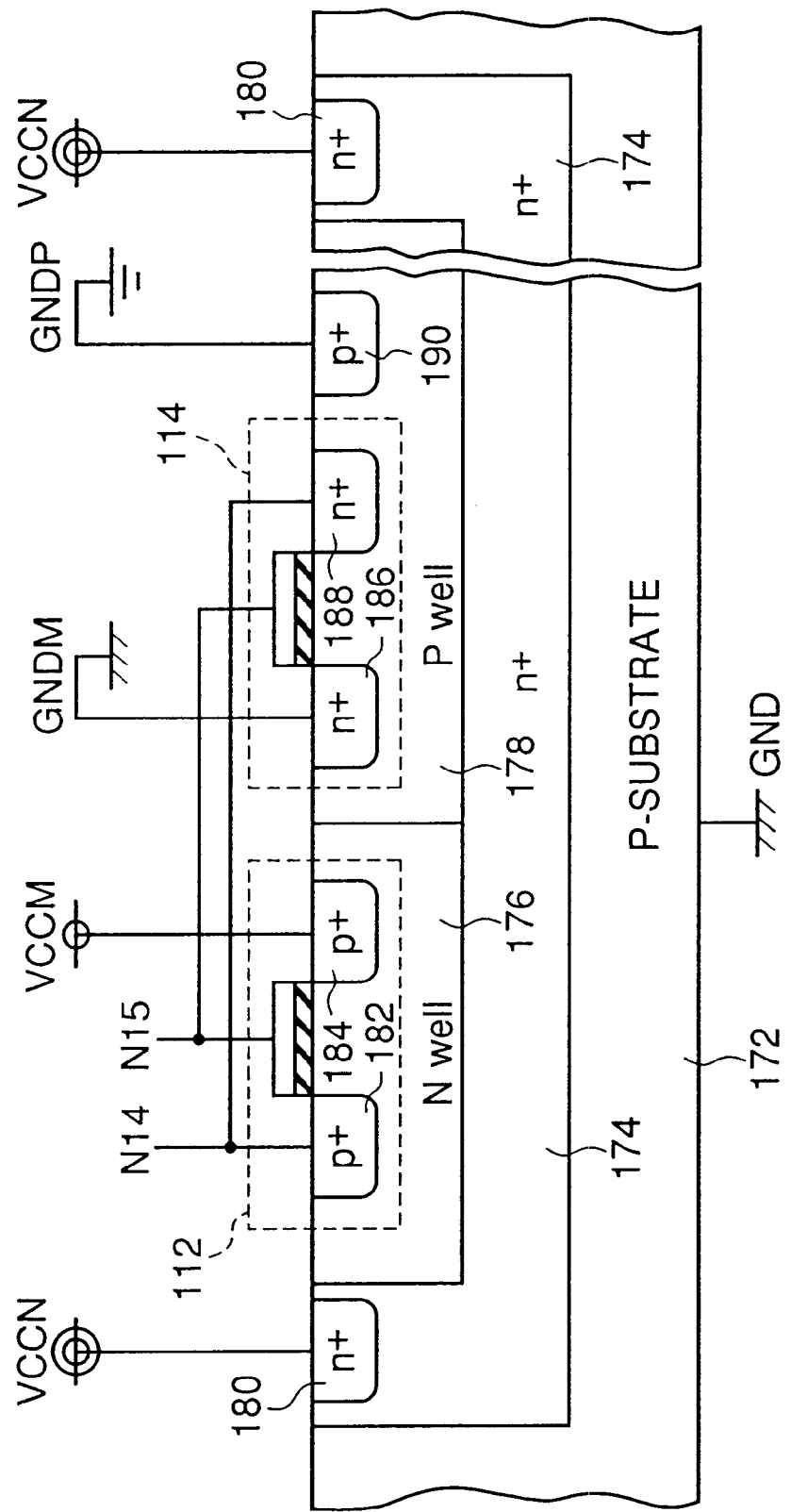
FIG. 9 is a cross section enlargedly showing a portion in which the circuit illustrated in FIG. 6 is formed in the configuration of the memory array shown in FIG. 8.

FIG. 9 is a cross section enlargedly showing the portion in which the circuit illustrated in FIG. 6 is formed in the configuration of the memory array in FIG. 8.

Referring to FIG. 9, the n+ type buried layer 174 is provided on the P-substrate 172. In each of the peripheral portions of the buried layer 174, an n+ type impurity region 180 is provided. The power supply potential VCCN is supplied to the impurity region 180. The N-well 176 and the P-well 178 are provided in the upper part of the buried layer 174. The P-channel MOS transistor 112 is provided in the N-well 176. The P-channel MOS transistor 112 includes an impurity region 184 as the source and an impurity region 182 as the drain. The impurity region 184 is coupled to the power supply potential VCCM and the impurity region 182 is connected to the node N14. The gate of the P-channel MOS transistor 112 is connected to the node N15.

In the P-well 178, the N-channel MOS transistor 114 and an p+ type impurity region 190 are provided. The ground potential GNDP as a potential of the P-well 178 is applied to the impurity region 190. The N-channel MOS transistor 114 includes an impurity region 186 as the source and an impurity region 188 as the drain. The impurity region 186 is coupled to the ground potential GNDM. The impurity region 188 is connected to the node N14. The gate of the N-channel MOS transistor 114 is connected to a node N15.

With such a configuration, the power supply potential VCCN as a substrate potential of the P-channel MOS transistors 112 and 116 as load transistors of the memory cell and the power supply potential VCCM to be applied to the memory cell can be controlled independently of each other, and the ground potential GNDP as a substrate potential applied to the N-channel MOS transistors 114 and 118 as driver transistors and the ground potential GNDM to be applied to the memory cell can be controlled independently of each other. It therefore becomes easier to specify a defective memory cell by a functional test. Since the storage node in the memory cell and the substrate can be isolated from each other, a new effect such that resistance to a software error is improved is produced.

Figure 10:
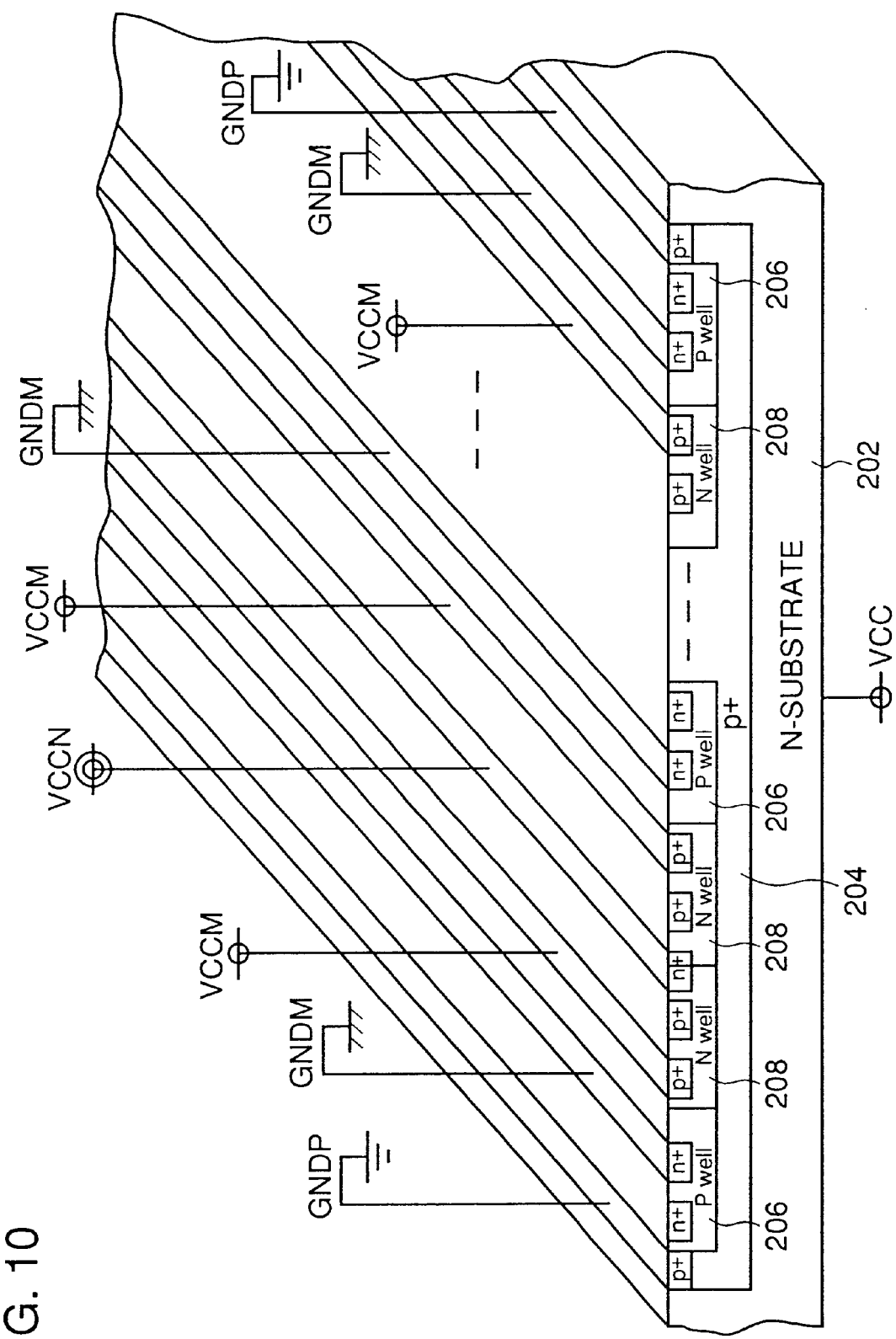
FIG. 10 is a diagram showing another configuration method of the memory cell array of the memory cell illustrated in FIG. 6.

FIG. 10 is a diagram showing another configuration method of the memory cell array of the memory cells illustrated in FIG. 6.

Referring to FIG. 10, a p+ type buried layer 204 is formed on the main surface of an N-substrate 202. In each of the peripheral portions of the buried layer 204, a p+ type impurity region is formed, and the ground potential GNDP is applied to the impurity region. The ground potential GNDP is supplied to the buried layer 204.

P-wells 206 and N-wells 208 are provided in the upper part of the buried layer 204. An n+ type impurity region as the source region of a transistor is formed in the P-well, and the ground potential GNDM is applied to the impurity region.

On the other hand, a p+ type impurity region serving as the source of a transistor is formed in the P-well 206, and the power supply potential VCCM is applied to the impurity region. An n+ type impurity region is formed in the N-well 208 to apply the potential to the N-well 208, and the power supply potential VCCN is applied to the impurity region.

Figure 11:
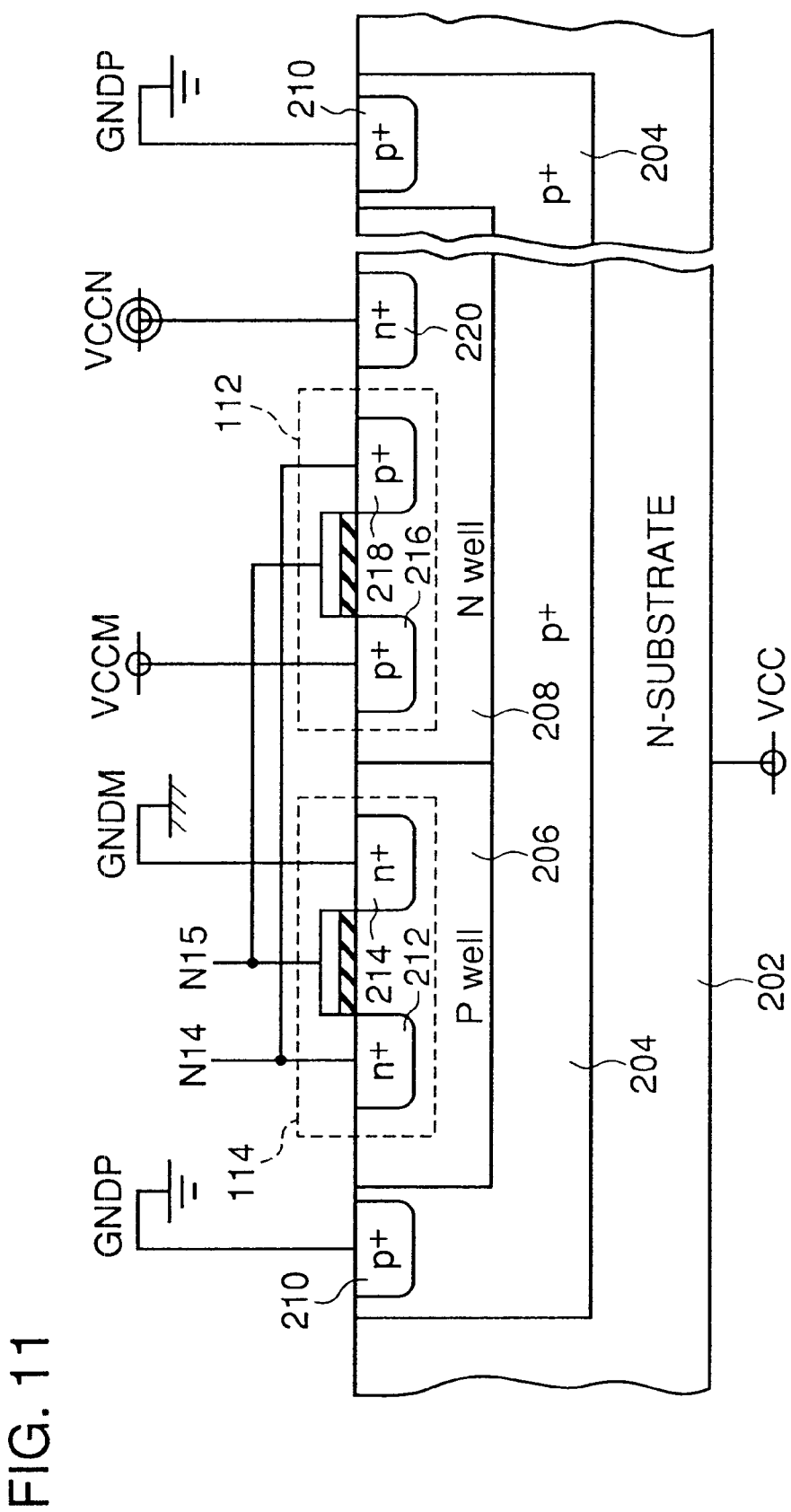
FIG. 11 is a cross section enlargedly showing a state where transistors in the memory cell in FIG. 6 are formed in the structure of the memory cell array illustrated in FIG. 10.

FIG. 11 is a cross section enlargedly showing a state where transistors in the memory cell in FIG. 6 are formed in the structure of the memory cell array illustrated in FIG. 10.

Referring to FIG. 11, the N-substrate 202 is coupled to the power supply potential VCC. The p+ type buried layer 204 is formed on the main surface of the N-substrate 202. A p+ type impurity region 210 is formed in each of the peripheral portions of the buried layer 204, and the ground potential GNDP is applied to the impurity region 210. The P-well 206 and the N-well 208 are formed in the upper part of the buried layer 204. The N-channel MOS transistor 114 is formed in the P-well 206. The N-channel MOS transistor 114 includes an impurity region 214 as the source and an impurity region 212 as the drain. The impurity region 214 is coupled to the ground potential GNDM. The impurity region 212 is connected to the node N14. The gate of the N-channel MOS transistor 114 is connected to the node N15.

The P-channel MOS transistor 112 and an n+ type impurity region 220 are provided in the N-well 208. The impurity region 220 is coupled to the power supply potential VCCN. The power supply potential VCCN is supplied to the N-well 208 via the impurity region 220. The P-channel MOS transistor 112 includes an impurity region 216 serving as the source and an impurity region 218 serving as the drain. The impurity region 216 is coupled to the power supply potential VCCM and the impurity region 218 is connected to the node N14.

With such a configuration, the power supply potential VCCN as a substrate potential of the P-channel MOS transistors 112 and 116 and the power supply potential VCCM of the memory cell can be isolated from each other, and the ground potential GNDP as a substrate potential of the N-channel MOS transistors 114 and 118 and the ground potential GNDM of the memory cell can be isolated from each other. A standby defective cell can be therefore detected. By replacing the standby defective cell with a redundant memory cell, the yield can be improved. Further, since the storage node in the memory cell and the substrate can be isolated from each other, a new effect such that resistance to a soft error is improved is produced.

Sixth Embodiment

Figure 12:
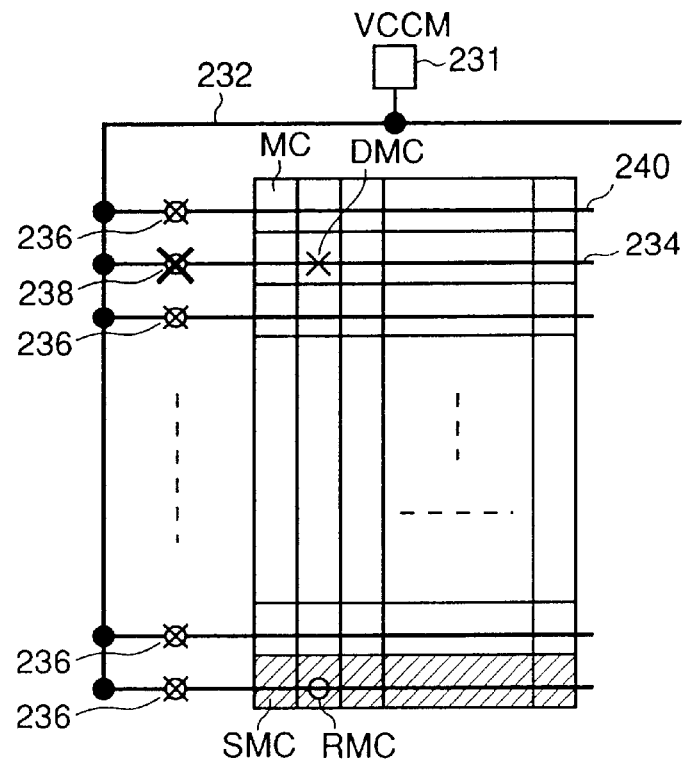

FIG. 12 is a diagram for explaining repair of a memory cell which becomes defective due to a standby failure or the like.

Referring to FIG. 12, a power line 232 for supplying the power supply potential from a pad 231 to which the power supply potential VCCM is applied to each of memory cells MC is provided. FIG. 12 shows an example in which a power supply line 240 is provided in the lateral direction for each of the memory cells. The power supply lines 240 and 232 are connected via a fuse 236. A row of spare memory cells SMC is disposed at an end of the memory array.

When a defective memory cell DMC is detected by the test described above, a fuse 238 connected to the memory cell is disconnected and is replaced with the spare memory cell. A memory cell RMC is the memory cell with which the defective memory cell DMC is replaced. The fuse is disconnected by, for example, a laser beam or fusing by passing a heavy current. Since the fuse 238 connected to the defective memory cell DMC is disconnected, the power supply potential VCCM is not supplied to a power line 234 and the standby current failure can be fixed. An effect such that the yield is improved is obtained.

Figure 13:
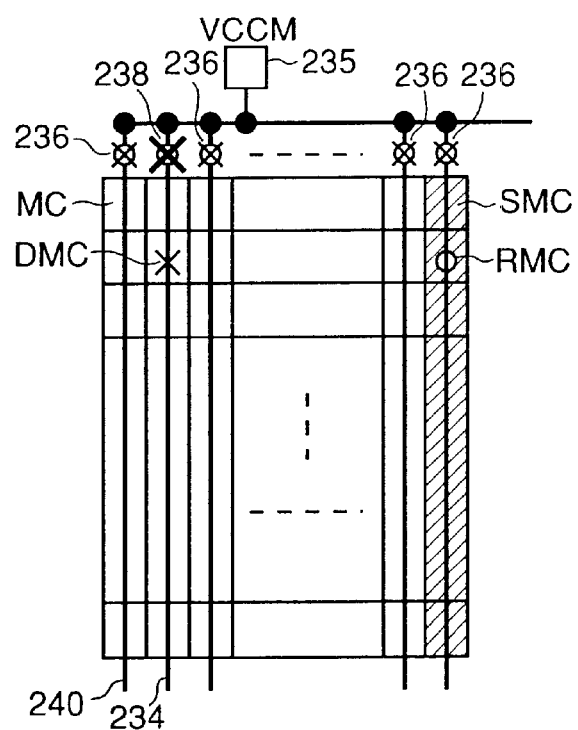
FIG. 13 is a diagram for explaining a second example of repairing a memory cell.

FIG. 13 is a diagram for explaining a second example of repairing a memory cell.

FIG. 13 shows an example in which a power supply line for a memory cell is laid in the longitudinal direction. Referring to FIG. 13, a power supply line for supplying the power supply potential from a pad 235 to which the power supply potential VCCM is applied to each of the memory cells MC is provided. FIG. 13 shows an example in which the power supply line 240 is laid in the longitudinal direction for each of the memory cells. The power supply lines 240 and 232 are connected to each other via the fuse 236. A column of spare memory cells SMC is disposed at an end of the memory array.

The disconnection of the fuse to replace the defective memory cell with the memory cell RMC is similar to that in the case described in FIG. 12, so that its description is not repeated here. In the case of the second repairing example shown in FIG. 13 as well, the standby current failure can be similarly fixed, and an effect such that the yield is improved is obtained.

Figure 14:
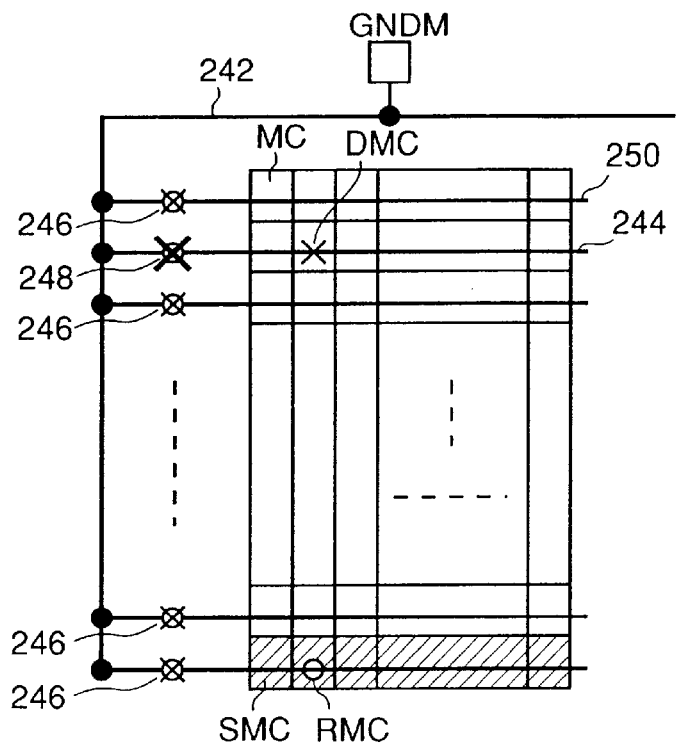
FIG. 14 is a diagram for explaining a third example of repairing a memory cell.

FIG. 14 is a diagram for explaining a third example of repairing a memory cell.

Referring to FIG. 14, a ground line 242 for supplying the ground potential from the pad to which the ground potential GNDM is applied to each of the memory cells MC is provided. FIG. 14 shows an example in which a ground line 250 for each of the memory cells is laid in the lateral direction. The ground lines 250 and 242 are connected to each other via a fuse 246. A row of spare memory cells SMC is disposed at an end of the memory array.

The disconnection of the fuse to replace the defective memory cell DMC with the memory cell RMC is similar to that in the case described in FIG. 12, so that its description is not repeated here. In the case of the third repairing example shown in FIG. 14 as well, the standby current failure can be similarly fixed, and an effect such that the yield is improved is obtained.

Figure 15:
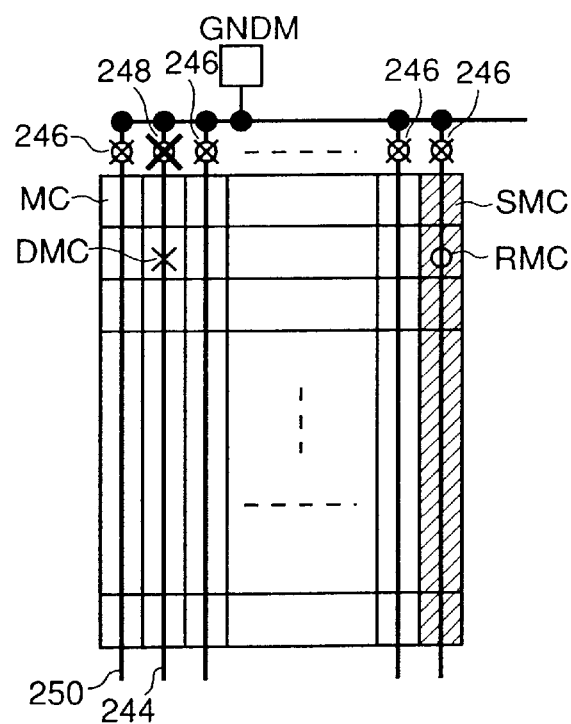
FIG. 15 is a diagram for explaining a fourth example of repairing a memory cell.

FIG. 15 is a diagram for explaining a fourth example of repairing a memory cell.

FIG. 15 shows an example where a ground line for memory cells is laid in the longitudinal direction. Referring to FIG. 15, a ground line for supplying the ground potential from a pad to which the ground potential GNDM is applied to each of the memory cells MC is provided. FIG. 15 shows an example in which the ground line 250 for each of the memory cells is laid in the longitudinal direction. The ground line 250 and the pad are connected via the fuse 246. A column of spare memory cells SMC is disposed at an end of the memory array.

The disconnection of the fuse to replace the defective memory cell DMC with the memory cell RMC is similar to that in the case described in FIG. 12, so that its description is not repeated here. In the case of the fourth repairing example shown in FIG. 15 as well, the standby current failure can be similarly fixed, and an effect such that the yield is improved is obtained.

Figure 16:
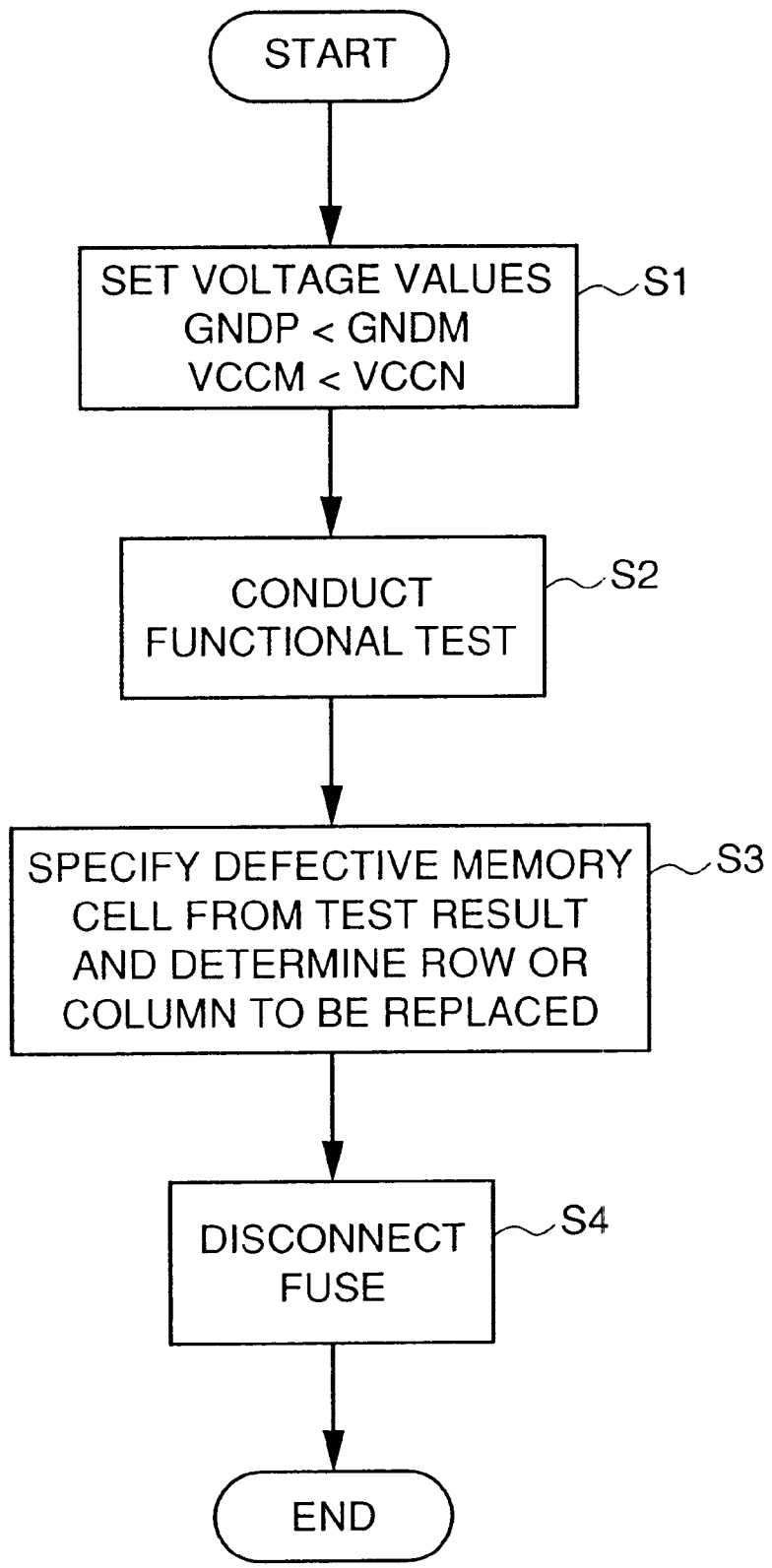
FIG. 16 is a flowchart showing the procedure of repairing a memory cell.
Figure 17:
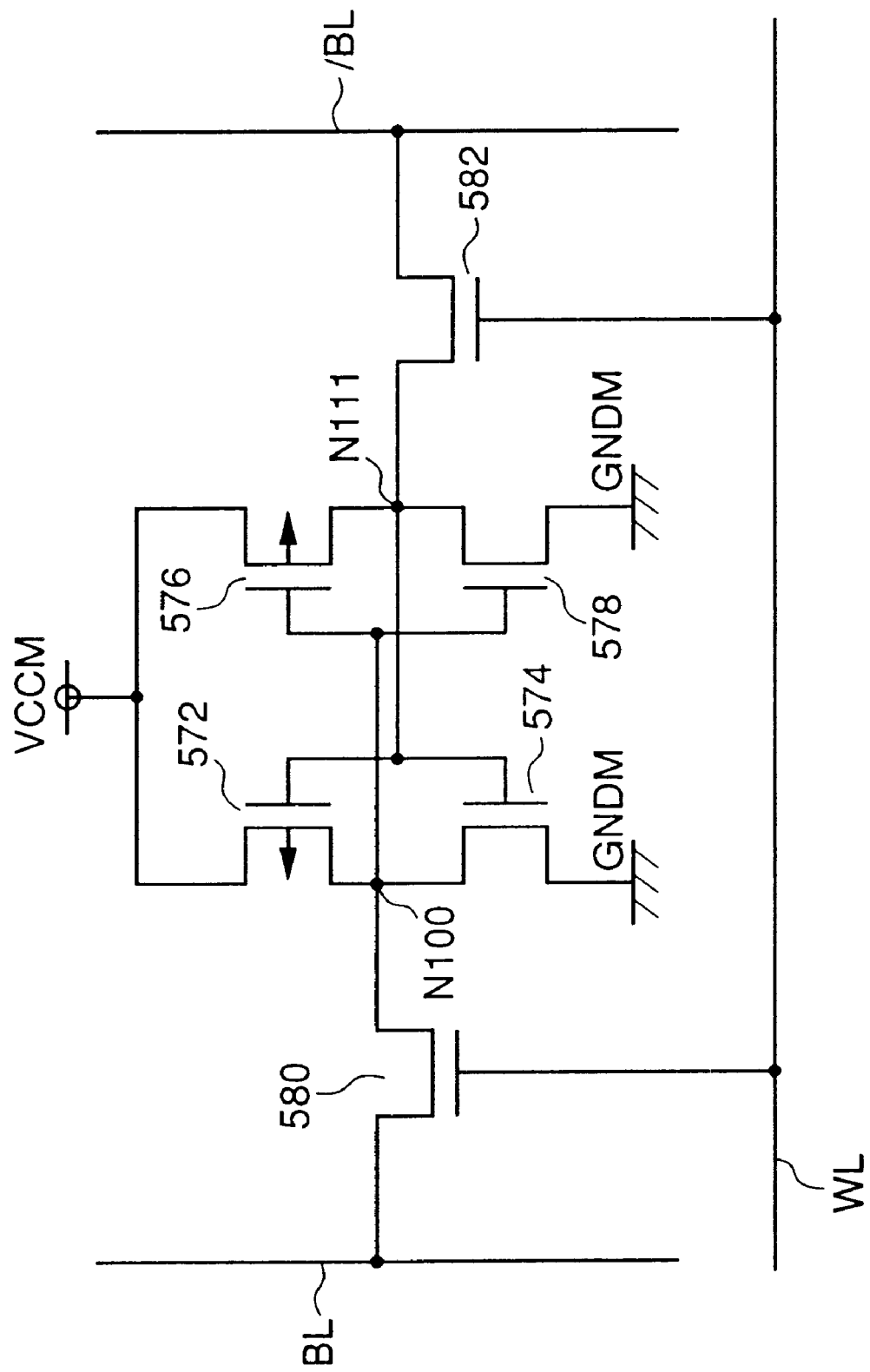
FIG. 17 is a circuit diagram showing the configuration of a conventional CMOS SRAM memory cell.

FIG. 16 is a flowchart showing a procedure of repairing a memory cell.

Referring to FIG. 16, in step S1, the power supply potential and the ground potential to be supplied to a memory cell and a substrate potential are set. Specifically, the ground potential GNDP as a substrate potential of a transistor, that is, the potential of the well is set to a potential lower than the ground potential GNDM of the memory cell. The power supply potential VCCM is set to a potential lower than the power supply potential VCCN. By the setting, the threshold voltage of the transistor constructing the memory cell increases, and conditions become severer than ordinary conditions for the operation of the memory cell.

Subsequently, in step S2, a functional test is conducted. An address signal and data are supplied to the memory array and are read.

In step S3, a defective memory cell is specified from the result of the functional test, and a row or column to be replaced is determined in order to efficiently repair the defective memory cell.

In step S4, the fuse is disconnected. Two kinds of fuses are disconnected; a fuse to be disconnected to perform an operation of selecting a spare memory cell in the case where an address corresponding to the defective memory cell is supplied; and a fuse to be disconnected to stop the supply of the power source current to the defective memory cell as shown in FIGS. 12 to 15. After that, the device is enclosed in a package and an operation check is made again.

The repair of the memory cell has completed. The repair of a memory cell can be performed by processes as described above, and the memory cell which cannot be conventionally repaired can be repaired. Thus, the yield can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device formed on a main surface of a semiconductor substrate, comprising a memory cell array including a plurality of memory cells each having a storage node for storing data, which are arranged into a matrix, each of said memory cells including:
   a first field effect transistor of a second conduction type, formed in a first well of a first conduction type formed in said semiconductor substrate, and having its drain connected to said storage node;
   a first power supply node receiving a first power supply potential and connected to a source of said first field effect transistor;
   a second power supply node receiving a second power supply potential and connected to said first well; and
   a first pad connected to said first power supply node;
   a second pad connected to said second power supply node;
   a peripheral circuit for performing a control for transmitting/receiving data to/from said memory cell array;
   a third power supply node for supplying a third power supply potential to said peripheral circuit; and
   a third pad connected to said third power supply node, wherein said first and third pads are disposed adjacent to each other.

2. The semiconductor memory device according to claim 1, wherein each of said memory cells further includes:

a second field effect transistor of said first conduction type, formed in a second well of said second conduction type formed in said semiconductor substrate, having its drain connected to said storage node;

a third power supply node receiving a third power supply potential and connected to a source of said second field effect transistor;

a fourth power supply node receiving a fourth power supply potential and connected to said second well;

a third field effect transistor of said second conduction type formed in said first well, having its drain connected to a complementary storage node holding data complementary to said storage node, and having its source connected to said first power supply node; and a fourth field effect transistor of said first conduction type formed in said second well, having its drain connected to said complementary storage node, and having its source connected to said second power supply node, both gates of said first and second field effect transistors are connected to said complementary storage node, and both gates of said third and fourth field effect transistors are connected to said storage node.

3. The semiconductor memory device according to claim 1, further comprising a third well of a conduction type different from that of said semiconductor substrate, in which said first and second wells are formed, and which is formed in said semiconductor substrate so as to be deeper than said first and second wells.

4. The semiconductor memory device according to claim 1, wherein said first conduction type is an N type and said second conduction type is a P type.

5. The semiconductor memory device according to claim 1, wherein said first conduction type is a P type and said second conduction type is an N type.

6. A method of testing a semiconductor memory device formed on the main surface of a semiconductor substrate, including a memory cell array including a plurality of memory cells each having a storage node for storing data, which are arranged in a matrix, each of said memory cells including:

a first field effect transistor of a second conduction type, formed in a first well of a first conduction type formed in said semiconductor substrate, and having its drain connected to said storage node;

a first power supply node receiving a first power supply potential and connected to a source of said first field effect transistor; and a second power supply node receiving a second power supply potential and connected to said first well, the method comprising:

a step of setting said second power supply potential to a potential different from said first power supply potential; and a step of conducting a functional test of writing data to said storage node and reading said data.

7. The method of testing the semiconductor memory device according to claim 6, wherein said first conduction type is an N type, said second conduction type is a P type, and said second power supply potential is set to a potential higher than said first power supply potential.

8. The method of testing the semiconductor memory device according to claim 6, wherein said first conduction type is a P type, said second conduction type is an N type, and said second power supply potential is set to a potential lower than said first power supply potential.

9. The method of testing the semiconductor memory device according to claim 6, wherein each of said memory cells further includes:

a second field effect transistor of the first conduction type, formed in a second well of the second conduction type formed in said semiconductor substrate, and having its drain connected to said storage node, a third power supply node receiving a third power supply potential and connected to a source of said second field effect transistor, a fourth power supply node receiving a fourth power supply potential and connected to said second well, a third field effect transistor of said second conduction type formed in said first well, having its drain connected to a complementary storage node holding data complementary to said storage node, and having its source connected to said first power supply node, and a fourth field effect transistor of said first conduction type formed in said second well, having its drain connected to said complementary storage node, and having its source connected to said second power supply node;

both gates of said first and second field effect transistors are connected to said complementary storage node;

both gates of said third and fourth field effect transistors are connected to said storage node;

said first conduction type is an N type;

said second conduction type is a P type; and said second power supply potential is set to a potential higher than said first power supply potential;

the method further comprising the step of setting said fourth power supply potential to a potential lower than said third power supply potential.

* * * * *